(12) United States Patent
Masuda et al.

(10) Patent No.: US 12,381,547 B2
(45) Date of Patent: Aug. 5, 2025

(54) LAYOUT OF GATE DRIVER CIRCUIT FOR HIGH-SPEED SWITCHING DEVICES

(71) Applicant: Murata Manufacturing Co., Ltd., Nagaokakyo (JP)

(72) Inventors: Shohei Masuda, Markham (CA); Ahmad Yafaoui, Markham (CA); Andrew Dickson, Markham (CA)

(73) Assignee: MURATA MANUFACTURING CO., LTD., Kyoto (JP)

( * ) Notice: Subject to any disclaimer, the term of this patent is extended or adjusted under 35 U.S.C. 154(b) by 15 days.

(21) Appl. No.: 18/285,547

(22) PCT Filed: Apr. 14, 2022

(86) PCT No.: PCT/US2022/024811
§ 371 (c)(1),
(2) Date: Oct. 4, 2023

(87) PCT Pub. No.: WO2022/221531
PCT Pub. Date: Oct. 20, 2022

(65) Prior Publication Data
US 2024/0178828 A1    May 30, 2024

Related U.S. Application Data

(60) Provisional application No. 63/175,239, filed on Apr. 15, 2021.

(51) Int. Cl.
*H03K 17/042* (2006.01)
*H03K 17/0424* (2006.01)

(52) U.S. Cl.
CPC ... *H03K 17/04206* (2013.01); *H03K 17/0424* (2013.01); *H03K 2217/0081* (2013.01)

(58) Field of Classification Search
CPC ....... H03K 2217/0081; H03K 17/0424; H03K 17/04213; H03K 17/04206
See application file for complete search history.

(56) References Cited

U.S. PATENT DOCUMENTS

| 7,965,522 B1 * | 6/2011 | Hornberger ............. H02M 1/08 363/21.1 |
| 10,431,424 B2 | 10/2019 | Mavretic et al. |

(Continued)

FOREIGN PATENT DOCUMENTS

| CN | 111884492 A | 11/2020 |
| WO | 2018/148218 A1 | 8/2018 |

OTHER PUBLICATIONS

Half-bridge power device gate driver circuit with isolation using integrated magnetic component and carrier signal phase switching, IEEE Xplore, Sep. 15, 2011 (Year: 2011).*

(Continued)

*Primary Examiner* — Patrick C Chen
(74) *Attorney, Agent, or Firm* — Keating & Bennett, LLP

(57) ABSTRACT

A switching circuit includes a first switch; a second switch connected in series with the first switch; a first isolated driver connected to a gate terminal of the first switch; a second isolated driver connected to a gate terminal of the second switch; and a transformer including a primary winding connected to an auxiliary power supply, a first secondary winding to supply a first voltage to the first isolated driver, and a second secondary winding to supply a second voltage to the second isolated driver.

21 Claims, 3 Drawing Sheets

(56) References Cited

U.S. PATENT DOCUMENTS

| | | |
|---|---|---|
| 2012/0133420 A1 | 5/2012 | Draxelmayr et al. |
| 2015/0381065 A1 | 12/2015 | Yonezawa et al. |
| 2018/0109173 A1 | 4/2018 | Nishijima |
| 2020/0076415 A1* | 3/2020 | Lee .................. H03K 17/04123 |

OTHER PUBLICATIONS

Official Communication issued in International Patent Application No. PCT/US2022/024811, mailed on Aug. 1, 2022.

* cited by examiner

LAYOUT OF GATE DRIVER CIRCUIT FOR HIGH-SPEED SWITCHING DEVICES

CROSS REFERENCE TO RELATED APPLICATIONS

This application claims the benefit of U.S. Patent Application No. 63/175,239 filed on Apr. 15, 2021. The entire contents of this application are hereby incorporated by reference.

BACKGROUND OF THE INVENTION

1. Field of the Invention

The present invention relates to high-speed switching devices. More specifically, the present invention relates to an optimized layout of a gate driver circuit for high-speed switching devices.

2. Description of the Related Art

Gallium nitride high-electron-mobility transistors (GaN HEMTs) are widely used for high-power applications, including, for example, server and telecommunications applications. GaN HEMTs achieve high-frequency, high-efficiency, and high-density power conversion. However, GaN HEMTs typically require drivers that are supplied with power from auxiliary power supplies, which connects the GaN HEMTs, the drivers, and the auxiliary power supplies together. In addition, special care is required to drive GaN HEMTs because GaN HEMTs have a low gate-source threshold voltage that can cause the GaN HEMTs to unexpectedly turn-on, i.e., self-turn-on, when exposed to a small amount of electromagnetic interference (EMI) or noise. Unexpected turn-on of the GaN HEMTs causes limitations and problems in the physical layout of the circuit with the GaN HEMTs, including the gate driver circuit of the GaN HEMTs. GaN HEMTs typically have very fast switching, thereby causing large voltage spikes, i.e., large voltage changes over time (dv/dt), in connected circuitry, which can increase noise.

Due to the sensitivity of GaN HEMTs, it is desirable that the lines connected to the gates of the GaN HEMTs be as short as possible. The lines connected to the gates of the GaN HEMTs can be patterns or traces on a printed circuit board (PCB) or other substrate. Typically, in circuit layouts, an auxiliary power supply is located far from a gate driver circuit (e.g., the auxiliary power supply and the gate driver may be located on different PCBs), such that the lines between the gate driver circuit and the auxiliary power supply can be susceptible to EMI or noise. Also, a gate-line current loop defined by the line between the isolated driver and the gate of the GaN HEMT and the line between the source of the GaN HEMT and the ground of the isolated driver of the gate driver circuit tends to be long (e.g., greater than about two times a width of the GaN HEMT), increasing parasitic inductances, which causes self-turn-on of the GaN HEMTs. Additionally, the complexity of the gate signal pattern layout can significantly increase in topologies where multiple GaN HEMTs are used.

FIG. 1 is a block diagram of a known circuit including switches $Q_1$ and $Q_2$, which can be GaN HEMTs, and associated driver circuitry, including isolated drivers $IC_1$ and $IC_2$. The switches $Q_1$ and $Q_2$ are connected in series, with the switch $Q_1$ being a high-side GaN HEMT and the switch $Q_2$ being a low-side GaN HEMT. A controller 100 provides signals that turn on and off the switches $Q_1$ and $Q_2$ via the isolated drivers $IC_1$ and $IC_2$. The isolated driver $IC_1$ is a high-side isolated driver and is connected to the high-side switch $Q_1$, and the isolated driver $IC_2$ is a low-side isolated driver and is connected to the low-side switch $Q_2$. An auxiliary power supply 101, which, for example, can be a DC power supply that rectifies pulse voltages received from auxiliary windings of an LLC converter, provides a high-side voltage $V_{ccH}$ to the isolated driver $IC_1$ and a low-side voltage $V_{ccL}$ to the isolated driver $IC_2$. The auxiliary power supply 101 is also connected to a low-side ground terminal $GND_H$ of the isolated driver $IC_1$ and a low-side ground terminal $GND_L$ of the isolated driver $IC_2$. The low-side ground terminal $GND_H$ of the isolated driver $IC_1$ is connected to a source terminal $S_1$ of the switch $Q_1$, and the low-side ground terminal $GND_L$ of the isolated driver $IC_2$ is connected to a source terminal $S_2$ of the switch $Q_2$. An input voltage $V_{in}$ is provided across a drain terminal $D_1$ of the switch $Q_1$ and the source terminal $S_2$ of the switch $Q_2$. Gate terminals $G_1$ and $G_2$ of the switches $Q_1$ and $Q_2$ are respectively driven by voltages output from the isolated drivers $IC_1$ and $IC_2$ according to control signals provided to the isolated drivers $IC_1$ and $IC_2$ by the controller 100.

As shown in FIG. 1, the lines connecting the isolated drivers $IC_1$ and $IC_2$ and respective gates $G_1$ and $G_2$ of the switches $Q_1$ and $Q_2$ are as short as possible to provide reliable operation by reducing the influence of EMI or noise. Although the components of the circuit shown in FIG. 1 may be concentrated in a small area to provide reliable operation, this solution may not be possible in certain applications due to the size of the circuit, components, packaging, etc. For example, an auxiliary power supply may be located far from the gate driver circuit, e.g., the auxiliary power supply and the gate driver may be located on different PCBs, which results in gate-line current loop being a long current loop that is susceptible to EMI or noise.

SUMMARY OF THE INVENTION

To overcome the problems described above, preferred embodiments of the present invention provide printed circuit board (PCB) layouts of high-speed switching devices that each simplify PCB layout design even if an application requires high power density packaging in which the PCB layout is constrained.

Preferred embodiments of the present invention with layouts of gate driver circuitry for high-speed switching devices can include one or more of the following features:
1) A transformer located between an auxiliary power supply and gate driver circuitry to simplify the circuit layout design so that the gate lines can be made shorter as compared to if a transformer is not included in the gate driver circuitry. For example, the gate line can be made as short as the width of one of the high-speed switching devices.
2) To decrease parasitic inductance, the gate-line current loop can be made shorter compared to conventional layouts of gate driver circuitry, even if a line between the auxiliary power supply and the gate driver circuitry is long. For example, the gate-line current loop can be made as short as the width of one of the high-speed switching devices, even if the auxiliary power supply and the gate driver circuitry are located on different PCBs.
3) By locating the transformer between the auxiliary power supply and the gate driver circuitry, an increase in noise caused by large voltage spikes, i.e., large voltage changes over time (dv/dt), can be significantly reduced or prevented due to the decoupling of the gate currents and the current of the auxiliary power supply.

4) By using the inherent properties of a structure of a transformer, the complexity of the design of gate driver circuitry can be significantly reduced.

According to a preferred embodiment of the present invention, a switching circuit includes a first switch; a second switch connected in series with the first switch; a first isolated driver connected to a gate terminal of the first switch; a second isolated driver connected to a gate terminal of the second switch; and a transformer including a primary winding connected to an auxiliary power supply, a first secondary winding to supply a first voltage to the first isolated driver, and a second secondary winding to supply a second voltage to the second isolated driver.

The switching circuit can further include a first rectifier connected between the first secondary winding and the first isolated driver and a second rectifier connected between the second secondary winding and the second isolated driver. Each of the first switch and the second switch can be a GaN transistor. A source terminal of the first switch can be connected to a drain terminal of the second switch. The switching circuit can further include a control circuit connected to each of the first isolated driver and the second isolated driver. An output of the transformer to the first isolated driver can be located on a different side of the transformer from an output of the transformer to the second isolated driver. A size of the transformer can be smaller than a size of either of the first isolated driver or the second isolated driver. Each of the first switch, the second switch, the first isolated driver, the second isolated driver, and the transformer can be provided on a single circuit board or a single substrate. A length of at least one of a first gate line connected between the first isolated driver and the gate terminal of the first switch and a second gate line connected between the second isolated driver and the gate terminal of the second switch can be equal to or shorter than a width of at least one of the first switch and the second switch. A first gate-line current loop of the first switch can be defined by a path from the first isolated driver to the gate terminal of the first switch and to a ground terminal of the first isolated driver; a second gate-line current loop of the second switch can be defined by a path from the second isolated driver to the gate terminal of the second switch and to a ground terminal of the second isolated driver; and a length of at least one of the first gate-line current loop and the second gate-line current loop can be equal to or shorter than a width of at least one of the first switch and the second switch.

According to a preferred embodiment of the present invention, a gate driver device includes a substrate including terminals to receive an auxiliary voltage from an auxiliary power supply that is not located on the substrate; a first switch and a second switch that are located on the substrate and that are connected in series; a first isolated driver that is located on the substrate, that is connected to the first switch, and that includes first input circuitry and first output circuitry that are isolated from each other; a second isolated driver that is located on the substrate, that is connected to the second switch, and that includes second input circuitry and second output circuitry that are isolated from each other; a transformer that is located on the substrate and that includes a primary winding to receive the auxiliary voltage, a first secondary winding to supply a first voltage to the first output circuitry, and a second secondary winding to supply a second voltage to the second output circuitry.

The gate driver device can further include a first rectifier connected between the first secondary winding and the first isolated driver and a second rectifier connected between the second secondary winding and the second isolated driver. Each of the first switch and the second switch can be a GaN transistor. A source terminal of the first switch can be connected to a drain terminal of the second switch. A first line connecting the transformer to the first isolated driver can be located on a different side of the transformer from a second line connecting the transformer to the second isolated driver. A size of the transformer can be smaller than a size of either of the first isolated driver or the second isolated driver. The first isolated driver and the second isolated driver can be located on a first side of the substrate; and the first switch, the second switch, and the transformer can be located on a second side of the substrate opposite to the first side. A length of at least one of a first gate line connected between the first isolated driver and a gate terminal of the first switch and a second gate line connected between the second isolated driver and a gate terminal of the second switch can be equal to or shorter than a width of at least one of the first switch and the second switch. A first gate-line current loop of the first switch can be defined by a path from the first isolated drivers to a gate terminal of the first switch and to a ground terminal of the first isolated driver; a second gate-line current loop of the second switch can be defined by a path from the second isolated driver to the gate terminal of the second switch and to a ground terminal of the second isolated driver; and a length of at least one of the first gate-line current loop and the second gate-line current loop can be equal to or shorter than a width of at least one of the first switch and the second switch.

According to a preferred embodiment of the present invention, a gate driver system includes the gate driver device of one of the various preferred embodiments of the present invention and the auxiliary power supply that is not located on the substrate.

The gate driver system can further include a control circuit connected to each of the first isolated driver and the second isolated driver. The auxiliary power supply can be a pulse voltage power supply.

The above and other features, elements, characteristics, steps, and advantages of the present invention will become more apparent from the following detailed description of preferred embodiments of the present invention with reference to the attached drawings.

DETAILED DESCRIPTION OF PREFERRED EMBODIMENTS

Figure 1:
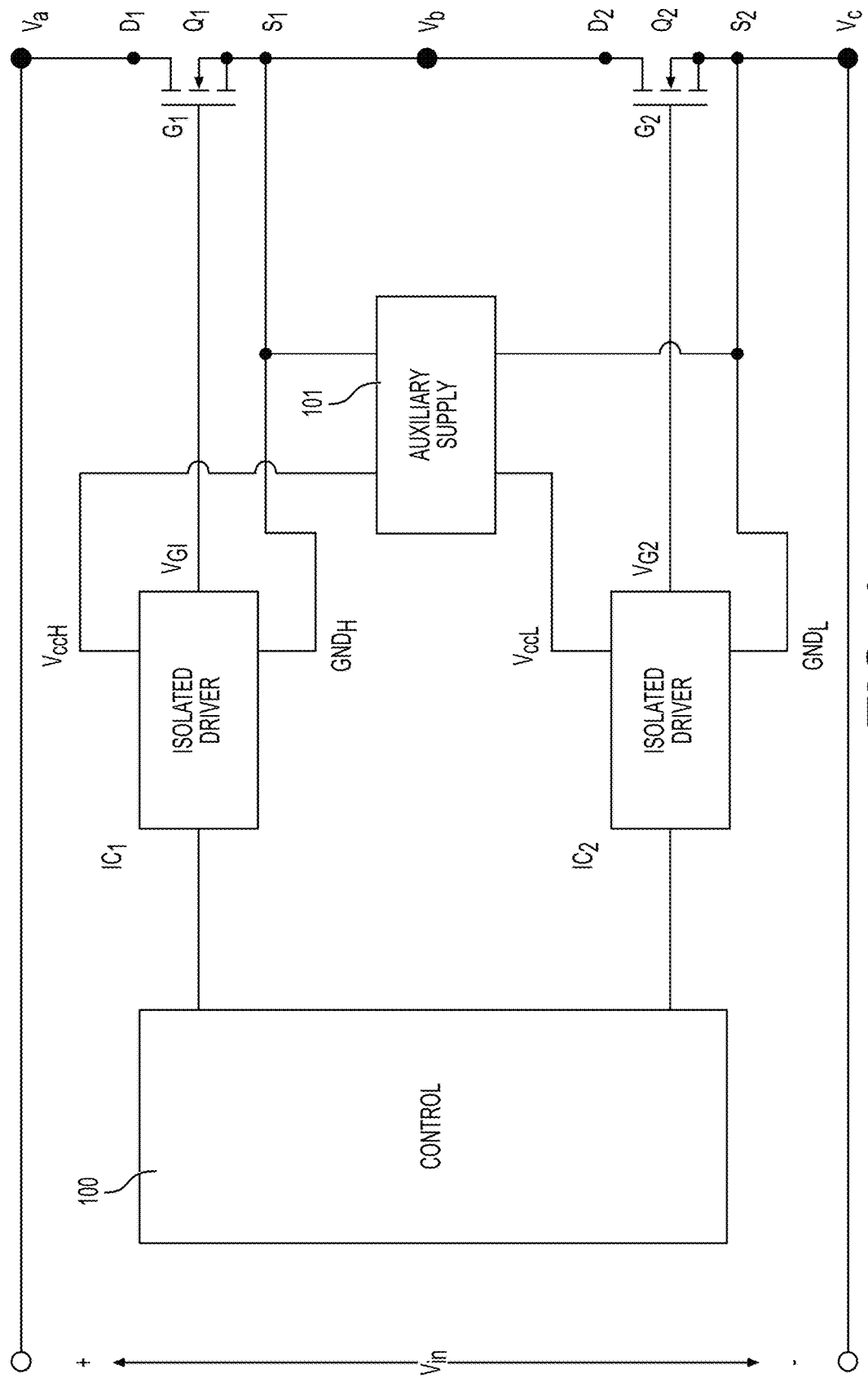
FIG. 1 is a block diagram of a known gate driver circuit.
Figure 2:
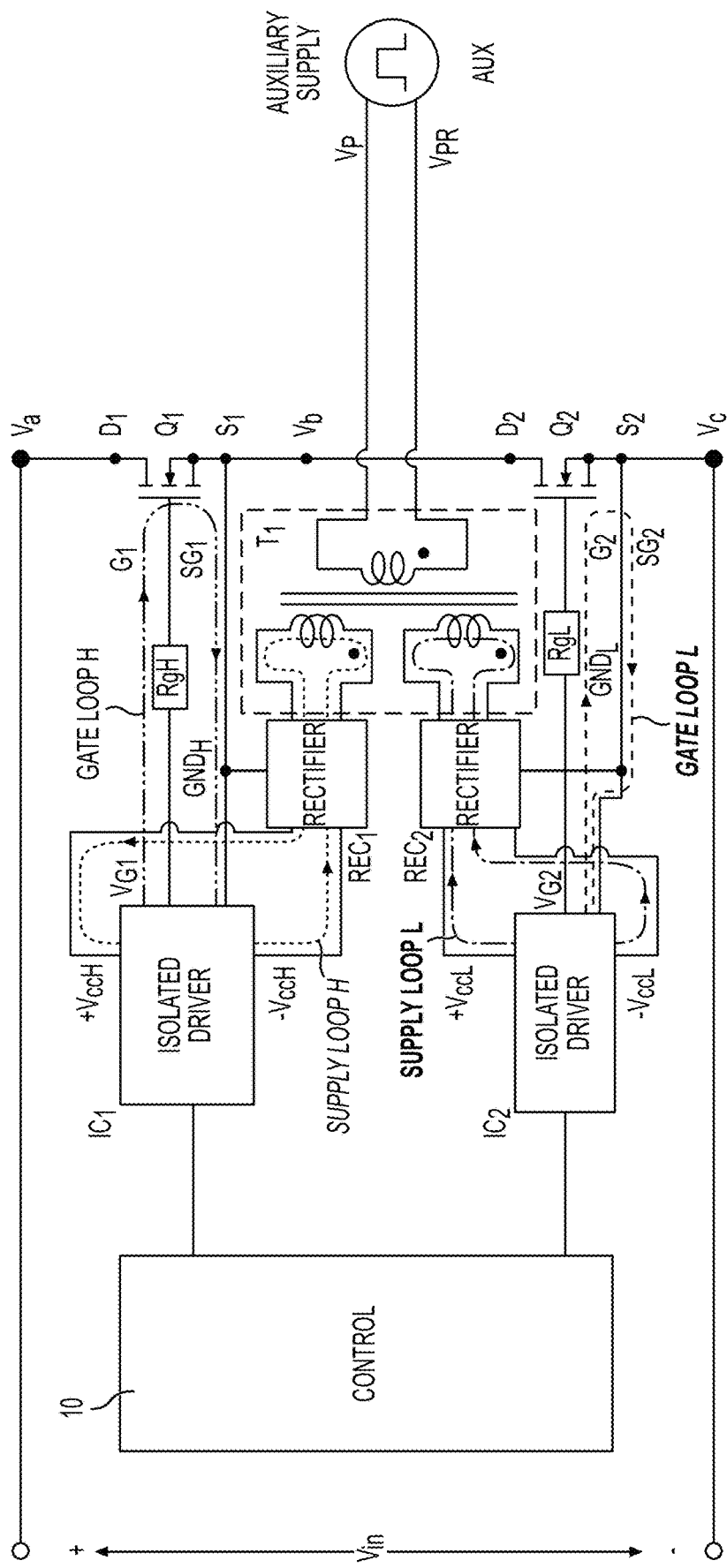
FIG. 2 is a block diagram of a gate driver circuit with a transformer located between isolated drivers and an auxiliary power supply.

FIG. 2 shows that gate driver circuitry with a transformer $T_1$ provided between the gate driver circuitry and the auxiliary power supply AUX, where the gate driver circuitry and an auxiliary power supply AUX can be placed far apart, e.g., the gate driver and the auxiliary power supply AUX and may be located on different PCBs. The gate driver circuitry includes a controller 10, isolated drivers $IC_1$ and $IC_2$ that receive signals from the controller 10, and switches $Q_1$ and $Q_2$ connected in series and including gates terminals G1 and G2 connected to the isolated drivers $IC_1$ and $IC_2$. The gate driver circuitry can include a gate resistor RgH connected between the controller 10 and to the gate terminal G1 of switch $Q_1$ and a gate resistor RgL connected between the controller 10 and to the gate terminal G2 of switch $Q_2$. Switches $Q_1$ and $Q_2$ can be high-power and/or fast-switching transistors such as GaN HEMTs. Terminals of an input voltage $V_{in}$ can be provided across a drain terminal $D_1$ of the switch $Q_1$ and the source terminal $S_2$ of the switch $Q_2$. The gate driver circuitry includes the transformer $T_1$ respectively connected to the isolated drivers $IC_1$ and $IC_2$ via rectifiers $REC_1$ and $REC_2$. The transformer $T_1$ is also connected to the auxiliary power supply AUX. The controller 10 can be any suitable controller, including, for example, a digital signal processor (DSP) or a microcontroller. The controller 10 can include a single controller or can include multiple controllers. Transformer $T_1$ can be any suitable transformer. Rectifiers $REC_1$ and $REC_2$ can be any suitable rectifiers, including, for example, small signal Schottky diodes. The isolated drivers $IC_1$ and $IC_2$ can be any suitable isolated drivers that provide enough source/sink current and high-speed switching to turn on/off the switches $Q_1$ and $Q_2$. The auxiliary power supply AUX may be a pulse-voltage power supply.

Isolated drivers such as isolated drivers $IC_1$ and $IC_2$ can be used in applications in which a controller, such as controller 10, is located on a different side of an isolation barrier as the devices to be driven, such as switches $Q_1$ and $Q_2$. For example, in a converter with a transformer that provides isolation between a primary side and a secondary side of the transformer, if the controller is located on the primary side of the transformer, then an isolated driver can be used to drive devices on the secondary side of the transformer, while maintaining the isolation barrier between the primary and secondary sides of the transformer. Conversely, if the controller is located on the secondary side of the transformer, then an isolated driver can be used to drive devices on the primary side of the transformer, while maintaining the isolation barrier between the primary and secondary sides of the transformer.

Because of the isolation between the inputs and the outputs of the isolated driver, each of the input circuitry and the output circuitry of the isolated driver must be independently supplied with power. The output circuitry of the isolated drivers can be powered by an auxiliary power supply that is separate from the power supply circuitry that powers the input circuitry of the isolated drivers. The input circuitry of the isolated drivers can be powered by the same power supply circuitry as the controller (not shown). For example, the power supply that supplies voltage to the controller 10 can also supply power and ground of the isolated drivers $IC_1$ and $IC_2$. The isolation in the isolated drivers can be provided by any suitable device, including, for example, a transformer, an opto-isolator, etc.

In the gate driver circuit of FIG. 2, the transformer $T_1$ can be relatively small in size, while still being able to supply power to the gate driver circuitry, and the transformer $T_1$ can be smaller in size than each of the switches $Q_1$ and $Q_2$. However, the transformer $T_1$ decouples the signals between the auxiliary power supply AUX and the switches $Q_1$ and $Q_2$, in particular, at the gates G1 and $G_2$ of the switches $Q_1$ and $Q_2$. Accordingly, the switches $Q_1$ and $Q_2$ can be cleanly switched by significantly reducing or preventing any effect of noise from the auxiliary power supply AUX.

The controller 10 can be any suitable controller. The controller 10 can be an IC chip or suitable device that provides control signals to turn on and off switching devices, such as GaN HEMTs. For example, the controller 10 can provide pulse-width modulation (PWM) signals to control the switches $Q_1$ and $Q_2$ based on the output of a converter in which the switches $Q_1$ and $Q_2$ are included.

As shown in FIG. 2, the auxiliary power supply AUX includes two terminals that supply voltages $V_P$ and $V_{PR}$ to a primary winding of the transformer $T_1$. The transformer $T_1$ includes first and second secondary windings that are respectively connected to rectifiers $REC_1$ and $REC_2$. The first secondary windings can supply a first voltage to the high-side isolated driver $IC_1$, and the second secondary winding can supply a second voltage to the low-side isolated driver $IC_2$. The first and the second voltages can be different, depending on the turns ratio of the first and the second secondary windings. That is, the outputs of the transformer $T_1$ separately power the isolated drivers $IC_1$ and $IC_2$ via the corresponding rectifiers $REC_1$ and $REC_2$.

Rectifier $REC_1$ is a high-side rectifier that provides a high-side voltage $V_{ccH}$ to the isolated driver $IC_1$, and rectifier $REC_2$ is a low-side rectifier that provides a low-side voltage $V_{ccL}$ to the isolated driver $IC_2$. Rectifier $REC_1$ is also connected to a low-side ground terminal $GND_H$ of the isolated driver $IC_1$, and rectifier $REC_2$ is also connected to a low-side ground terminal $GND_L$ of the isolated driver $IC_2$. The low-side ground terminal $GND_H$ of the isolated driver $IC_1$ is connected to a source terminal $S_1$ of the switch $Q_1$, and the low-side ground terminal $GND_L$ of the isolated driver $IC_2$ is connected to a source terminal $S_2$ of the switch $Q_2$. FIG. 2 shows optional signal ground pins $SG_1$ and $SG_2$ that can be used in switches with four pins (i.e., drain, source, gate, and signal ground) to ensure proper gate-source voltage $V_{gs}$. An input voltage $V_{in}$ is provided across a drain terminal $D_1$ of the switch $Q_1$ and the source terminal $S_2$ of the switch $Q_2$. Gate terminals G1 and $G_2$ of the switches $Q_1$ and $Q_2$ are respectively driven by voltages $V_{G1}$ and $V_{G2}$ output from the isolated drivers $IC_1$ and $IC_2$ according to control signals provided to the isolated drivers $IC_1$ and $IC_2$ by a control device. The switches $Q_1$ and $Q_2$ are connected in series, with the source terminal $S_1$ of the switches $Q_1$ connected to the drain terminal $D_2$ of the switch $Q_2$. The switches $Q_1$ and $Q_2$ are preferably transistors, for example.

A gate-line current loop (Gate loop H/Gate loop L) of each of the switches $Q_1$ and $Q_2$ is defined by a path from the isolated drivers $IC_1$ and $IC_2$ to the corresponding gate terminal G1 and $G_2$ and to ground $GND_H$ and $GND_L$ of the isolated drivers $IC_1$ and $IC_2$. A power-supply current loop (Supply loop H/Supply loop L) of the power supplied to each of the isolated drivers $IC_1$ and $IC_2$ is defined by a path from the low-side voltages $-V_{ccH}$ and $-V_{ccL}$ of the isolated drivers $IC_1$ and $IC_2$, through the rectifiers $REC_1$ and $REC_2$ and secondary windings of the transformer $T_1$, and to the high-side voltages $+V_{ccH}$ and $+V_{ccL}$ of the isolated drivers $IC_1$ and $IC_2$. Accordingly, by including the transformer $T_1$ between the auxiliary power supply AUX and the isolated drivers $IC_1$ and $IC_2$, a length of the gate-line current loop (Gate loop H/Gate loop L) of each of the switches $Q_1$ and $Q_2$ and a length of the power-supply current loop (Supply loop H/Supply loop L) to each of the isolated drivers $IC_1$ and $IC_2$ can be significantly reduced. Therefore, clean switching can be provided due to the power-supply current loops (Supply loop H/Supply loop L) being less susceptible to EMI and noise caused by large voltage spikes, which provides more ideal switching waveforms with significantly reduced voltage spikes and dips.

Figure 3:
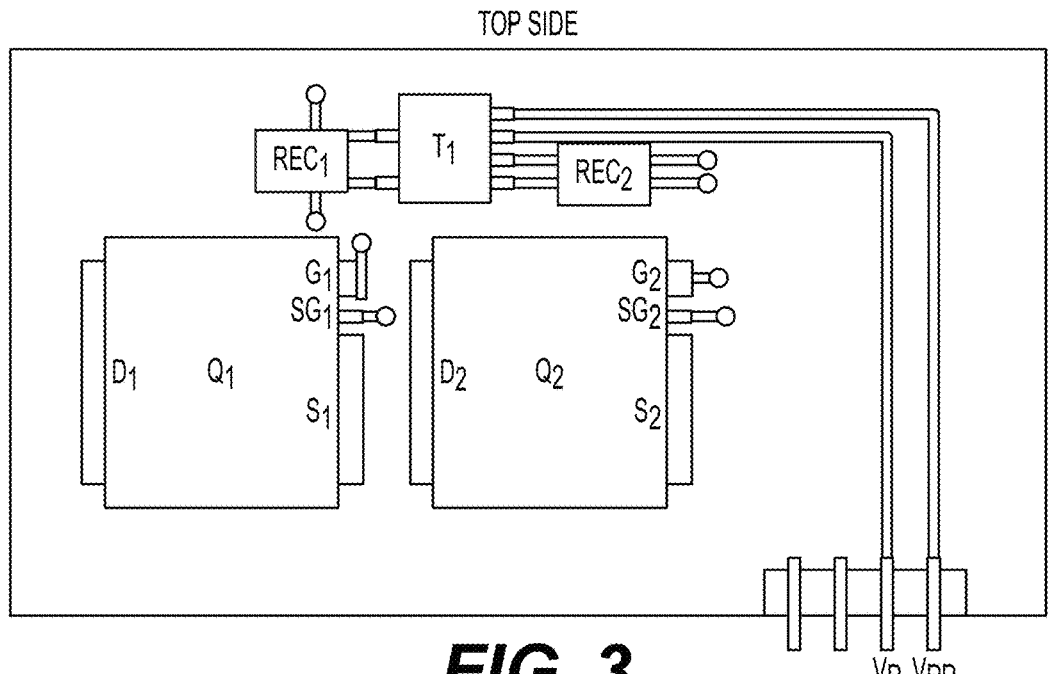
FIG. 3 shows a top view of a component layout of a substrate with a gate driver circuit.
Figure 4:
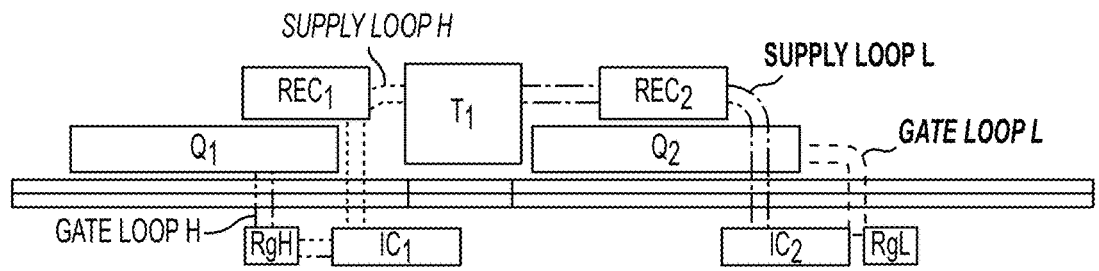
FIG. 4 is a schematic view showing components on the top and the bottom surfaces of the substrate of FIG. 3.
Figure 5:
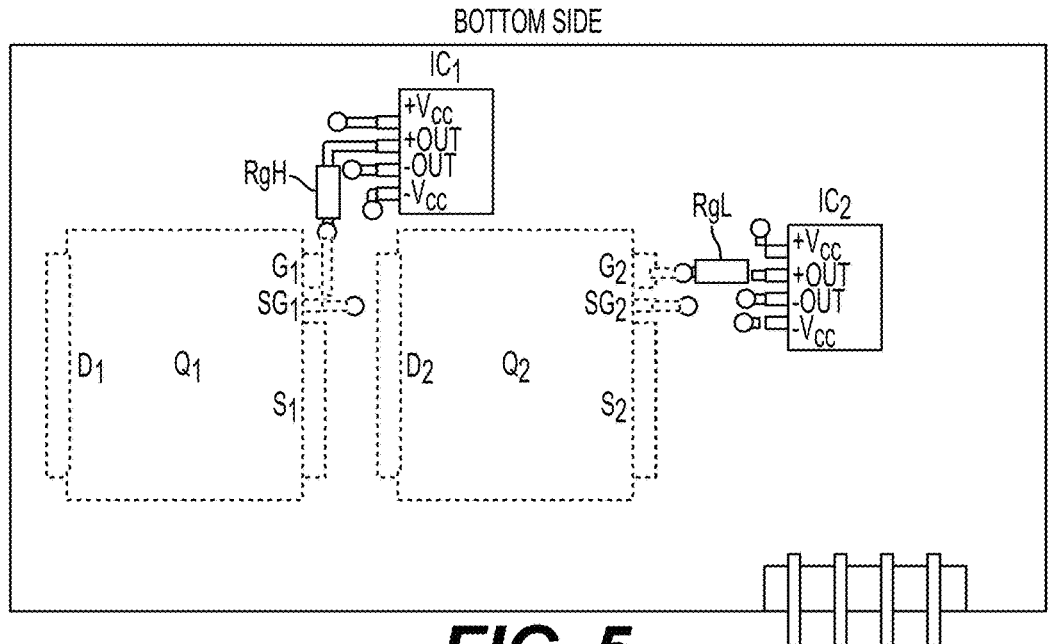
FIG. 5 shows a bottom view of a component layout of the substrate of FIG. 3.

FIGS. 3 and 5 show top and bottom sides of a substrate with an example of a component layout of a gate driver circuit, and FIG. 4 is a schematic view showing components on the top and the bottom surfaces of the substrate. Any suitable substrate can be used, including, for example, a PCB. As shown in FIGS. 3-5, the transformer $T_1$, rectifiers $REC_1$ and $REC_2$, switches $Q_1$ and $Q_2$ can be located on the top side of the substrate, and the isolated drivers $IC_1$ and $IC_2$ and the gate resistors RgH and RgL can be located on the bottom side of the substrate. By locating the transformer $T_1$ and the switches $Q_1$ and $Q_2$ on different sides of the substrate, the component placement and layout design of the rectifiers $REC_1$ and $REC_2$ can be simplified, and an area circumscribed by a current loop from the power supply (e.g., auxiliary power supply AUX) can be significantly reduced. In addition, by locating the isolated drivers $IC_1$ and $IC_2$ on the bottom side of the substrate, the gate-line current loop (Gate loop H/Gate loop L) of each of the switches $Q_1$ and $Q_2$ can be made relatively short, i.e., an area circumscribed by the gate-line current loop (Gate loop H/Gate loop L) of each of the switches $Q_1$ and $Q_2$ can be significantly reduced. For example, the gate-line current loop (Gate loop H/Gate loop L) of the switches $Q_1$ and $Q_2$ can be made as short as the width of one of the switches $Q_1$ and $Q_2$.

However, component arrangements other than those described above and shown in FIGS. 3-5 are also possible.

The auxiliary power supply AUX is not shown in FIGS. 3-5. The auxiliary power supply AUX is not located on the substrate and can be connected to the terminals corresponding to $V_p$ and $V_{PR}$ shown in FIG. 3. The controller 10, which is not shown in FIGS. 3-5, can be located on a different substrate. The power supply of the controller 10, which is not shown in FIGS. 3-5, can also be located on a different substrate and can provide power to the input circuitry of the isolated drivers $IC_1$ and $IC_2$.

As shown in FIGS. 3-5, each of the switches $Q_1$ and $Q_2$, the isolated drivers $IC_1$ and $IC_2$, the rectifiers $REC_1$ and $REC_2$, and the transformer $T_1$ can all be provided on a single substrate.

A line from the transformer $T_1$ to the rectifier $REC_1$ can be on a different side of the transformer $T_1$ than a line from the transformer $T_1$ to the rectifier $REC_2$, for example. By providing the lines from the transformer $T_1$ to the rectifiers $REC_1$ and $REC_2$ on different sides of the transformer $T_1$, the component placement and layout design of the gate driver circuitry and GaN HEMTs connected to the transformer can be simplified. This implementation is particularly advantageous if only the components provided for GaN HEMTs are mounted on a sub-board, and the sub-board is then connected to a main board.

It should be understood that the foregoing description is only illustrative of the present invention. Various alternatives and modifications can be devised by those skilled in the art without departing from the present invention. Accordingly, the present invention is intended to embrace all such alternatives, modifications, and variances that fall within the scope of the appended claims.

What is claimed is:

1. A switching circuit comprising:
   a first switch;
   a second switch connected in series with the first switch;
   a first isolated driver connected to a gate terminal of the first switch;
   a second isolated driver connected to a gate terminal of the second switch; and
   a transformer including a primary winding connected to an auxiliary power supply, a first secondary winding to supply a first voltage to the first isolated driver, and a second secondary winding to supply a second voltage to the second isolated driver; wherein
   a length of at least one of a first gate line connected between the first isolated driver and the gate terminal of the first switch and a second gate line connected between the second isolated driver and the gate terminal of the second switch is equal to or shorter than a width of at least one of the first switch and the second switch.

2. The switching circuit according to claim 1, further comprising:
   a first rectifier connected between the first secondary winding and the first isolated driver; and
   a second rectifier connected between the second secondary winding and the second isolated driver.

3. The switching circuit according to claim 1, wherein each of the first switch and the second switch is a GaN transistor.

4. The switching circuit according to claim 1, wherein a source terminal of the first switch is connected to a drain terminal of the second switch.

5. The switching circuit according to claim 1, further comprising a control circuit connected to each of the first isolated driver and the second isolated driver.

6. The switching circuit according to claim 1, wherein an output of the transformer to the first isolated driver is located on a different side of the transformer from an output of the transformer to the second isolated driver.

7. The switching circuit according to claim 1, wherein a size of the transformer is smaller than a size of either of the first isolated driver or the second isolated driver.

8. The switching circuit according to claim 1, wherein each of the first switch, the second switch, the first isolated driver, the second isolated driver, and the transformer is provided on a single circuit board or a single substrate.

9. A switching circuit comprising:
   a first switch;
   a second switch connected in series with the first switch;
   a first isolated driver connected to a gate terminal of the first switch;
   a second isolated driver connected to a gate terminal of the second switch; and
   a transformer including a primary winding connected to an auxiliary power supply, a first secondary winding to supply a first voltage to the first isolated driver, and a second secondary winding to supply a second voltage to the second isolated driver; wherein
   a first gate-line current loop of the first switch is defined by a path from the first isolated driver to the gate terminal of the first switch and to a ground terminal of the first isolated driver;
   a second gate-line current loop of the second switch is defined by a path from the second isolated driver to the gate terminal of the second switch and to a ground terminal of the second isolated driver; and
   a length of at least one of the first gate-line current loop and the second gate-line current loop is equal to or shorter than a width of at least one of the first switch and the second switch.

10. A gate driver device comprising:

a substrate including terminals to receive an auxiliary voltage from an auxiliary power supply that is not located on the substrate;

a first switch and a second switch that are located on the substrate and that are connected in series;

a first isolated driver that is located on the substrate, that is connected to the first switch, and that includes first input circuitry and first output circuitry that are isolated from each other;

a second isolated driver that is located on the substrate, that is connected to the second switch, and that includes second input circuitry and second output circuitry that are isolated from each other;

a transformer that is located on the substrate and that includes:

a primary winding to receive the auxiliary voltage;

a first secondary winding to supply a first voltage to the first output circuitry; and a second secondary winding to supply a second voltage to the second output circuitry.

11. The gate driver device according to claim 10, further comprising:

a first rectifier connected between the first secondary winding and the first isolated driver; and a second rectifier connected between the second secondary winding and the second isolated driver.

12. The gate driver device according to claim 10, wherein each of the first switch and the second switch is a GaN transistor.

13. The gate driver device according to claim 10, wherein a source terminal of the first switch is connected to a drain terminal of the second switch.

14. The gate driver device according to claim 10, wherein a first line connecting the transformer to the first isolated driver is located on a different side of the transformer from a second line connecting the transformer to the second isolated driver.

15. The gate driver device according to claim 10, wherein a size of the transformer is smaller than a size of either of the first isolated driver or the second isolated driver.

16. The gate driver device according to claim 10, wherein the first isolated driver and the second isolated driver are located on a first side of the substrate; and the first switch, the second switch, and the transformer are located on a second side of the substrate opposite to the first side.

17. The gate driver device according to claim 10, wherein a length of at least one of a first gate line connected between the first isolated driver and a gate terminal of the first switch and a second gate line connected between the second isolated driver and a gate terminal of the second switch is equal to or shorter than a width of at least one of the first switch and the second switch.

18. The gate driver device according to claim 10, wherein:

a first gate-line current loop of the first switch is defined by a path from the first isolated drivers to a gate terminal of the first switch and to a ground terminal of the first isolated driver;

a second gate-line current loop of the second switch is defined by a path from the second isolated driver to the gate terminal of the second switch and to a ground terminal of the second isolated driver; and a length of at least one of the first gate-line current loop and the second gate-line current loop is equal to or shorter than a width of at least one of the first switch and the second switch.

19. A gate driver system comprising:

the gate driver device of claim 10; and the auxiliary power supply that is not located on the substrate.

20. The gate driver system according to claim 19, further comprising a control circuit connected to each of the first isolated driver and the second isolated driver.

21. The gate driver system of claim 19, wherein the auxiliary power supply is a pulse voltage power supply.

* * * * *